United States Patent
Waechter et al.

(10) Patent No.: US 11,598,022 B2
(45) Date of Patent: Mar. 7, 2023

(54) VAPOR PHASE EPITAXY METHOD

(71) Applicant: AZUR SPACE SOLAR POWER GMBH, Heilbronn (DE)

(72) Inventors: Clemens Waechter, Lauffen am Neckar (DE); Gregor Keller, Heilbronn (DE); Daniel Fuhrmann, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 193 days.

(21) Appl. No.: 17/129,728

(22) Filed: Dec. 21, 2020

(65) Prior Publication Data
US 2021/0189595 A1 Jun. 24, 2021

(30) Foreign Application Priority Data
Dec. 20, 2019 (DE) .................... 10 2019 008 930.8

(51) Int. Cl.
*H01L 21/02* (2006.01)
*H01L 21/265* (2006.01)
*C30B 25/16* (2006.01)
*C30B 25/18* (2006.01)

(52) U.S. Cl.
CPC ............ *C30B 25/165* (2013.01); *C30B 25/18* (2013.01); *H01L 21/02538* (2013.01); *H01L 21/02636* (2013.01); *H01L 21/2654* (2013.01)

(58) Field of Classification Search
CPC . C30B 25/165; C30B 25/18; H01L 21/02538; H01L 21/02636; H01L 21/02293; H01L 21/2036
See application file for complete search history.

(56) References Cited

U.S. PATENT DOCUMENTS

| 3,419,742 A | 12/1968 | Herzog |
| 7,033,921 B2 | 4/2006 | Jurgensen |
| 7,378,334 B2 | 5/2008 | Nagahama et al. |

(Continued)

FOREIGN PATENT DOCUMENTS

| DE | 10 2004 034 103 A1 | 4/2005 |
| EP | 1385215 A2 | 1/2004 |

OTHER PUBLICATIONS

Glew et al., "GaAlAs/GaAs p-n-p Heterojunction Bipolar Transistors Grown by MOCVD," J. of Crystal Growth, vol. 68, pp. 450-452 (1984).

(Continued)

*Primary Examiner* — David Vu
*Assistant Examiner* — Brandon C Fox
(74) *Attorney, Agent, or Firm* — Muncy, Geissler, Olds & Lowe, P.C.

(57) ABSTRACT

A vapor phase epitaxy method of growing a III-V layer with a doping that changes from a first conductivity type to a second conductivity type on a surface of a substrate or a preceding layer in a reaction chamber from the vapor phase from an epitaxial gas flow comprising a carrier gas, at least one first precursor for an element from main group III, and at least one second precursor for an element from main group V, wherein when a first growth height is reached, a first initial doping level of the first conductivity type is set by means of a ratio of a first mass flow of the first precursor to a second mass flow of the second precursor, then the first initial doping level is reduced to a second initial doping level of the first or low second conductivity type.

11 Claims, 2 Drawing Sheets

(56) References Cited

U.S. PATENT DOCUMENTS 7,732,308 B2 6/2010 Schumacher et al.
8,030,665 B2 10/2011 Nagahama et al.
2013/0019944 A1 1/2013 Hekmatshoar-Tabari et al.

OTHER PUBLICATIONS

Schulte et al., "Controlled formation of GaAs pn junctions during hydride vapor phase epitaxy of GaAs," J. of Crystal Growth, vol. 352, pp. 253-257 (2012).

VAPOR PHASE EPITAXY METHOD

This nonprovisional application claims priority under 35 U.S.C. § 119(a) to German Patent Application No. 10 2019 008 930.8, which was filed in Germany on Dec. 20, 2019, and which is herein incorporated by reference.

BACKGROUND OF THE INVENTION

Field of the Invention

The present invention relates to a vapor phase epitaxy method.

Description of the Background Art

The most diverse vapor phase epitaxy systems, e.g., from the company Aixtron, for the epitaxial formation of semiconductor layers are known.

It is a common feature of the systems that the epitaxial layers are deposited or grown from the vapor phase on a substrate brought into a reaction chamber. To this end, the reaction chamber is heated and an epitaxial gas flow is introduced into the reaction chamber.

The composition of the gas flow depends on the type of layer to be grown, wherein typically precursors, such as, e.g., arsine and/or TMGa, supply the elements for the semiconductor layer to be grown and, if necessary, precursors for a dopant are also added for doping the layer. The precursors are fed into the reaction chamber by means of a carrier gas. Mass flow controllers are typically used to control the gas flow composition.

However, it should also be noted that due to the reactor history, other undesirable elements from previous processes may also still be present in the reaction chamber. This can be problematic especially for the formation of low-doped layers.

SUMMARY OF THE INVENTION

It is therefore an object of the present invention to provide a method that refines the state of the art.

According to an exemplary embodiment of the invention, a vapor phase epitaxy method is provided with the method step of growing a III-V layer with a doping that changes from a first conductivity type to a second conductivity type on a surface of a substrate or a preceding layer.

The first conductivity type is p and the second conductivity type is n.

In a reaction chamber, the III-V layer is grown from the vapor phase from an epitaxial gas flow.

The epitaxial gas flow has a carrier gas and at least one first precursor for an element from main group III and at least one second precursor for an element from main group V.

In addition, when a first growth height is reached, a first initial doping level of the first conductivity type is set by means of a ratio of a first mass flow of the first precursor to a second mass flow of the second precursor in the epitaxial gas flow and with or without the addition of a further precursor for a dopant of the first conductivity type to the epitaxial gas flow.

Then by stepwise or continuously increasing a mass flow of a third precursor for a dopant of the second conductivity type and/or by stepwise or continuously changing the ratio between the first mass flow and the second mass flow, a doping of the III-V layer over a junction region layer with a growth height of at least 10 µm is changed stepwise or continuously until a target doping level of the second conductivity type is reached.

It is understood that a III-V layer can have at least one component of main group III and at least one component of main group V, e.g., gallium and arsenic, but may also have a number of elements of main group III and/or V, e.g., additionally indium, or further elements of other groups.

Molecules that serve as the starting product for epitaxial growth are called precursors. A precursor is accordingly a molecule consisting of an element to be grown, e.g., an element of main group III or V, or a dopant, and at least one further element. In the case of organometallic precursors in particular, e.g., TMGa, at least one further element is carbon, which is released during growth and acts as a dopant.

If a precursor for a dopant is added, this is referred to as direct doping, whereas doping by means of the carbon of an organometallic precursor is referred to as autodoping.

The height and type of the doping of a III-V layer also depend on the quantity ratio between the main group III element and main group V element in the reaction chamber.

Depending on the type and size of the vapor phase system used, this quantity ratio within the reaction chamber fluctuates; i.e., the incoming gas flow has different V/III quantity ratios at different locations. Fluctuations of this type can occur in the area of a single substrate and/or across multiple substrates.

It is understood that changing the mass flow or changing the ratio of two different mass flows can be equivalent to changing a corresponding partial pressure or partial pressure ratio or is basically equivalent to each quantity control/quantity change.

It is also understood that the setting of the stated doping levels occurs during the growth or that the growth is continuous and the mass flows are changed during the growth or deposition.

First, the first initial doping level of the first conductivity type is set. For example, a pregrown layer or the substrate has a doping with a decreasing profile, wherein the first initial doping level is reached at the first growth height.

By changing the mass flow of the third precursor during the growth of the junction region layer, a reproducible profile can be achieved in the region of the p-n junction. An undesirable formation of serial multiple p-n junctions on the semiconductor wafers can be reliably suppressed, as can a formation of local differences in the dopant profiles.

A further advantage is that cross-contamination, for example, from the filling of the reactor chamber from previous epitaxial phases, can be reliably and effectively compensated, and layers with low dopings below $5 \cdot 10^{15}$ cm$^{-3}$ and in particular p-n junctions can be reliably produced starting from a p-doping.

Starting from a constant V/III ratio during the growth of the junction region layer of at least 10 µm, the previous blocking voltages, fluctuating strongly on the semiconductor wafers, with differences of more than 20 V or more than 100 V can be reduced.

Stated differently, local doping differences on the semiconductor wafer due to fluctuations in the V/III ratio and/or due to different background dopings in the epitaxial system are reduced.

The preceding layer or the substrate already can have a doping corresponding to the initial doping level, so that the setting when the first growth height is reached corresponds to a retention of the settings.

The pregrown layer or the substrate can have a higher doping, wherein the doping is reduced abruptly, stepwise, or continuously to the first initial level up to the first growth height.

It is understood that an abrupt change can describe a change in the doping without intermediate steps and over a very low growth height, e.g., at most a few nanometers.

The target doping level is then achieved via a ramp or step, therefore, a continuous or stepwise change in the doping in the growing layer over the junction region layer.

The ramp or step either follows directly, so that the doping changes directly starting from the first growth height. Alternatively, the ramp or step begins delayed in time, so that a layer with a constant doping is formed between the first growth height and the start of the ramp or step.

The change in the doping over the junction region layer takes place either exclusively by increasing the mass flow of the third precursor, e.g., silane, or the quantity ratio between the elements of main group III and V, i.e., between the first and second mass flow, is also changed. According to a further alternative, the changes in the doping are brought about solely by changing the quantity ratio between the elements of main group III and V.

It is understood that the epitaxial gas flow can already have a possibly low mass flow of the third precursor even when the first initial doping level is set, wherein the presence of the dopant of the second conductivity type is compensated accordingly by means of the V/III ratio and/or the mass flow of the further precursor.

For example, $H_2$ or $N_2$ is suitable as carrier gases for the epitaxial gas flows.

Due to local differences in the V/III ratio and/or background doping, an abrupt p-n junction, therefore, a change in the doping from p to n without intermediate steps and over a very low growth height, e.g., a few nanometers at most, especially with low dopings can lead to very different blocking voltages across individual semiconductor wafers and/or multiple semiconductor wafers.

Stated differently, fluctuations in the V/III ratio across the semiconductor wafer result in different local dopings and have a particularly strong effect especially at low dopings.

An advantage of the method is that the vapor phase epitaxy method can be carried out using a low flow of the second precursor for group V. If arsine or TGMa is used in particular for the second precursor, the production costs can be significantly reduced by means of a low flow of the second precursor and the environmental friendliness of the production process can be greatly increased.

By the stepwise or continuous changing of the doping across the thickness of a junction region layer with a constant or almost constant V/III ratio of the mass flows, in contrast, a p-n junction profile reproducible across the entire reaction chamber is achieved on the semiconductor wafer.

The differences in the incoming gas flow only have an effect on the absolute growth depth of the junction, wherein the differences in the absolute growth depth have a smaller influence on the blocking voltages achieved than a non-reproducible doping profile of the p-n junction.

By means of a mass flow controller for the mass flow of the third precursor as well as mass flow controllers for the mass flows of the first and second precursors, the step-shaped or ramp-shaped junction region of the invention can be controlled or implemented in a simple and reliable manner.

An advantage of the invention is thus that high dielectric strengths can be reliably achieved in a simple and reproducible manner without special requirements for the vapor phase epitaxy system used.

According to an example, the first initial doping level is an initial p-doping level and is at most $5 \cdot 10^{16}$ cm$^{-3}$ or at most $1 \cdot 10^{16}$ cm$^{-3}$ or at most $1 \cdot 10^{15}$ cm$^{-3}$ or at most $5 \cdot 10^{14}$ cm$^{-3}$.

Alternatively, the first initial doping level is an initial n-doping level and is at most $1 \cdot 10^{15}$ cm$^{-3}$ or at most $5 \cdot 10^{14}$ cm$^{-3}$ or at most $1 \cdot 10^{14}$ cm$^{-3}$. A low p-doping or even a very low n-doping level is thus selected as the starting point for the ramp or step.

The target n-doping level can be at most $5 \cdot 10^{16}$ cm$^{-3}$ or at most $1 \cdot 10^{16}$ cm$^{-3}$ or at most $1 \cdot 10^{15}$ cm$^{-3}$ or at most $5 \cdot 10^{14}$ cm$^{-3}$ or at most $1 \cdot 10^{14}$ cm$^{-3}$. The ramp or step thus covers a range of low doping levels.

According to a further refinement, the growth height of the junction region layer is at least 30 µm or at least 60 µm.

The doping over the junction region layer can be changed by at most $1 \cdot 10^{13}$ cm$^{-3}$ over 5 µm of growth height.

The doping over the junction region layer can be changed in at least four steps.

The element of main group III is gallium, and the element of main group V is arsenic, and/or the third precursor is monosilane.

In a refinement, after the target n-doping level has been reached over a growth height, a second target n-doping level is set by abruptly changing the third mass flow and/or by abruptly changing the ratio of the first mass flow to the second mass flow, wherein the second target n-doping level is greater than the target n-doping level.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
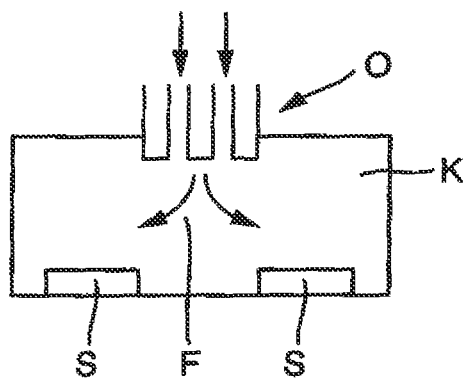
FIG. 1 shows a cross section of substrates arranged in a reaction chamber.

The illustration of FIG. 1 schematically shows a cross section of a reactor chamber K of a vapor phase epitaxy system. Substrates S are arranged on a bottom of reactor chamber K. In addition, reactor chamber K has a gas inlet member O through which epitaxial gas flow F is introduced into reactor chamber K.

The epitaxial gas flow F has a carrier gas, at least one first organometallic precursor for an element of main group III, e.g., TMGa, a second precursor for an element of main group V, e.g., arsine, and at least starting at a first growth height x1, a third precursor for an n-type dopant, e.g., silane.

The gas inlet member O has a plurality of lines ending in reactor chamber K, through which one component or multiple components of epitaxial gas flow F are fed into reactor chamber K.

Figure 2:
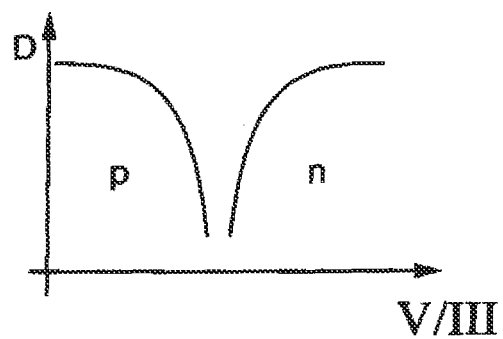
FIG. 2 shows a relationship between a doping and a ratio of elements of main group V to elements of main group III during epitaxial growth.

In the illustration of FIG. 2, the dependence of the doping on a quantity ratio of the elements of main groups V and III is plotted in a diagram. It becomes clear in particular that not only the level of doping but also the type of doping, therefore, n or p, can be set by the V/III ratio, therefore, the quantity ratio in the gas flow.

On the other hand, it becomes clear that fluctuations in the V/III ratio across a wafer or a substrate result in different dopings and that such fluctuations have a particularly strong effect, especially at low dopings.

One advantage of this embodiment is that the vapor phase epitaxy method can be carried out using a low flow of the second precursor for group V. If arsine or TGMa is used in particular for the second precursor, the production costs can be significantly reduced by means of a low flow of the second precursor and the environmental friendliness of the production process can be greatly increased.

Figure 3:
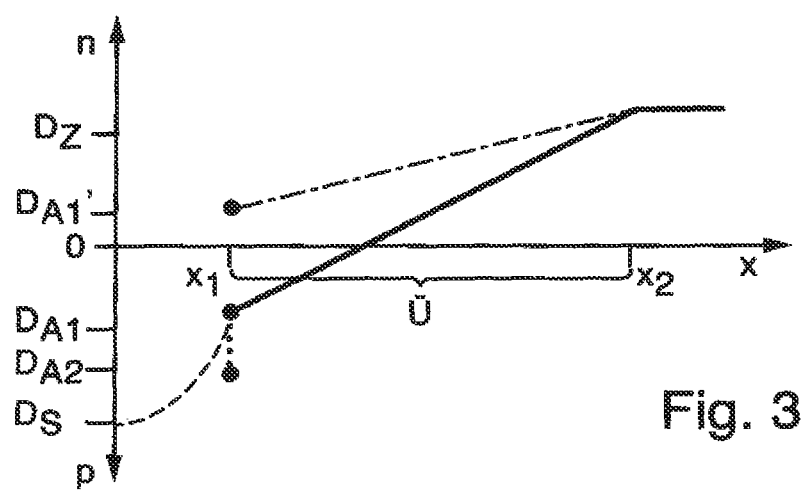
FIG. 3 shows a dopant concentration profile over a grown III-V layer according to a first embodiment of the vapor phase epitaxy method according to the invention.

A first embodiment of the vapor phase epitaxy method of the invention is illustrated in the diagram in FIG. 3 using a profile of doping D versus growth height x.

First or at a first growth height $x_1$, a first initial doping level $D_{A1}$ of the first conductivity type LT1 is set by means of the ratio of a first mass flow of the first precursor, e.g., TMGa, to a second mass flow of the second precursor, e.g., arsine, in the epitaxial gas flow F, and with or without the addition of a further mass flow of a further precursor for a dopant of the first conductivity type, e.g., carbon tetrabromide or dimethyl zinc, to the epitaxial gas flow F.

The third mass flow of the third precursor and/or the ratio between the first and second mass flow are then continuously changed over a junction region layer Ü, until a target p-doping level $D_Z$ is reached at a second growth height $x_2$. It is understood that the junction region layer Ü extends from the first growth height $x_1$ to the second growth height $x_2$.

The epitaxial gas flow F is then not changed further over a further region of the growth height x, so that the doping of the subsequent III-V layer remains constant. Alternatively (not shown), the doping is increased again abruptly to a second target doping level following the ramp.

Figure 4:
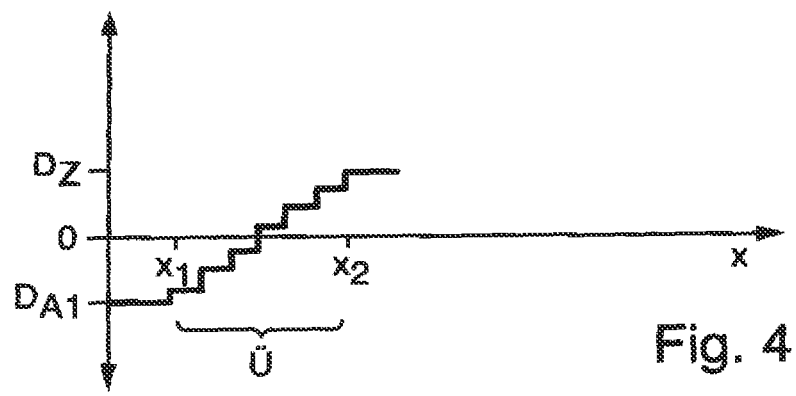
FIG. 4 shows a dopant concentration profile over a grown III-V layer according to a second embodiment of the vapor phase epitaxy method according to the invention.

In the diagram of FIG. 4, a further embodiment of the vapor phase epitaxy method of the invention is illustrated on the basis of the doping profile D, wherein only the differences from the diagram in FIG. 3 will be explained below.

The change in the doping from the initial n-doping level $D_{A1}$ to the target p-doping level $D_Z$ takes place in several steps, so that a step-shaped course of the doping over the junction region layer Ü is established.

Figure 5:
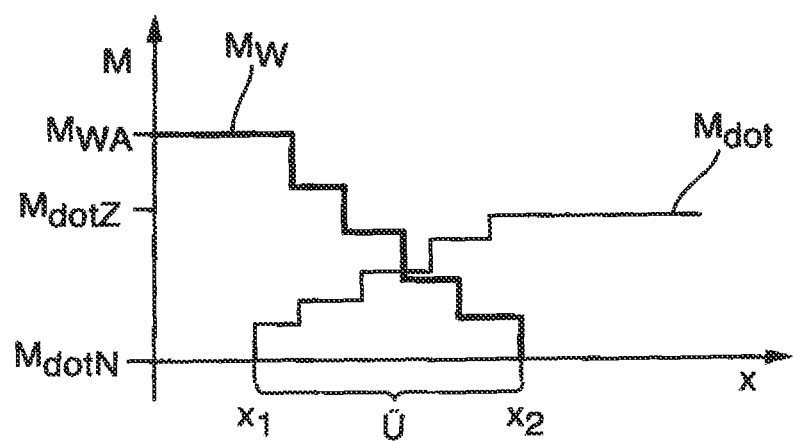
FIG. 5 shows the profile of the mass flow of the third precursor versus the growth height.

The diagram in FIG. 5 shows a further embodiment of the vapor phase epitaxy method of the invention on the basis of a profile of the mass flow $M_W$ of the further precursor for a p-type dopant and the mass flow $M_{Dot}$ of the third precursor for the n-type dopant.

Based on an initial mass flow level $M_{wa}$, to achieve the initial p-doping level $D_{A1}$, the mass flow $M_w$ of the further precursor for a p-type dopant is reduced stepwise at the layer thickness $x_1$ from the growth of the junction region layer Ü until at the layer thickness $x_2$ the mass flow is reduced to zero or close to zero. This allows the doping profile corresponding to FIG. 4 to be generated.

Alternatively, the mass flow $M_W$ of the further precursor for a p-type dopant is reduced continuously at the layer thickness $x_1$ starting from the growth of the junction region layer Ü until at the layer thickness $x_2$ the mass flow is reduced to zero or close to zero. This allows the ramp-shaped doping profiles corresponding to FIG. 3 to be generated.

It is understood that the doping profile can also be adjusted continuously, i.e., not in the form of a ramp, by changing the mass flow of the further precursor accordingly.

In a different approach, proceeding from an initial mass flow level $M_{dotN}$ at zero or close to zero, in order to achieve the initial p-doping level $D_{A1}$, the mass flow $M_{dot}$ of the third precursor for an n-type dopant is increased stepwise at the layer thickness $x_1$ starting from the growth of the junction region layer Ü until at the layer thickness $x_2$ the mass flow reaches the target level $M_{dotZ}$. This allows the doping profile corresponding to FIG. 4 to be generated.

Alternatively, the mass flow $M_{dot}$ of the third precursor for an n-type dopant is increased continuously at the layer thickness $x_1$ starting from the growth of the junction region layer Ü until at the layer thickness $x_2$ the mass flow reaches the target level $M_{dotZ}$. This allows the ramp-shaped doping profiles corresponding to FIG. 3 to be generated.

It is understood that the doping profile can also be adjusted continuously, i.e., not in the form of a ramp, by changing the mass flow of the third precursor accordingly.

It is understood that both the mass flow of the further precursor and the mass flow of the third precursor can be changed at the same time.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A vapor phase epitaxy method comprising:
   growing a III-V layer with a doping that changes from a first conductivity type to a second conductivity type on a surface of a substrate or a preceding layer in a reaction chamber from the vapor phase from an epitaxial gas flow comprising a carrier gas, at least one first precursor for an element from main group III, and at least one second precursor for an element from main group V, wherein the first conductivity type is p and the second conductivity type is n;
   setting, when a first growth height is reached, a first initial doping level of the first conductivity type via a ratio of a first mass flow of the first precursor to a second mass flow of the second precursor in the epitaxial gas flow; and
   increasing, stepwise or continuously, a mass flow of a third precursor for a dopant of the second conductivity type, a doping of the III-V layer over a junction region layer with a growth height of at least 10 μm is changed stepwise or continuously until a target doping level of the second conductivity type is reached.

2. The vapor phase epitaxy method according to claim 1, wherein the first initial doping level of the first conductivity type is at most $5 \cdot 10^{16}$ cm$^{-3}$ or at most $1 \cdot 10^{16}$ cm$^{-3}$ or at most $1 \cdot 10^{15}$ cm$^{-3}$ or at most $1 \cdot 10^{14}$ cm$^{-3}$.

3. The vapor phase epitaxy method according to claim 1, wherein the target doping level of the second conductivity type is at most $1 \cdot 10^{15}$ cm$^{-3}$ or at most $5 \cdot 10^{14}$ cm$^{-3}$ or at most $1 \cdot 10^{14}$ cm$^{-3}$.

4. The vapor phase epitaxy method according to claim 1, wherein the growth height of the junction region is at least 30 μm or at least 60 μm.

5. The vapor phase epitaxy method according to claim 1, wherein the doping over the junction region layer is changed by at most $1 \cdot 10^{13}$ cm$^{-3}$ over 5 μm of growth height.

6. The vapor phase epitaxy method according to claim 1, wherein the doping over the junction region layer is changed in at least four steps.

7. The vapor phase epitaxy method according to claim 1, wherein the element of main group III is gallium and the element of main group V is arsenic.

8. The vapor phase epitaxy method according to claim 1, wherein the third precursor is monosilane.

9. The vapor phase epitaxy method according to claim 1, wherein, after the target n-doping level has been reached over a growth height, a second target n-doping level is set by abruptly changing the third mass flow and/or by abruptly changing the ratio of the first mass flow to the second mass flow, wherein the second target n-doping level is greater than the target n-doping level.

10. The vapor phase epitaxy method according to claim 1, wherein said setting the first initial doping level of the first conductivity type via the ratio of the first mass flow of the first precursor to the second mass flow of the second precursor in the epitaxial gas flow is conducted with the addition of a further precursor for a dopant of the first conductivity type to the epitaxial gas flow.

11. A vapor phase epitaxy method comprising:
growing a III-V layer with a doping that changes from a first conductivity type to a second conductivity type on a surface of a substrate or a preceding layer in a reaction chamber from the vapor phase from an epitaxial gas flow comprising a carrier gas, at least one first precursor for an element from main group III, and at least one second precursor for an element from main group V, wherein the first conductivity type is p and the second conductivity type is n;
setting, when a first growth height is reached, a first initial doping level of the first conductivity type via a ratio of a first mass flow of the first precursor to a second mass flow of the second precursor in the epitaxial gas flow with the addition of a further precursor for a dopant of the first conductivity type to the epitaxial gas flow; and
increasing, stepwise or continuously, a mass flow of a third precursor for a dopant of the second conductivity type and by stepwise or continuously changing the ratio between the first mass flow and the second mass flow, a doping of the III-V layer over a junction region layer with a growth height of at least 10 μm is changed stepwise or continuously until a target doping level of the second conductivity type is reached.

* * * * *